United States Patent
Toyosato et al.

(10) Patent No.: US 8,970,213 B2
(45) Date of Patent: Mar. 3, 2015

(54) METHOD FOR MANUFACTURING MAGNETORESISTANCE EFFECT ELEMENT

(75) Inventors: Tomohiko Toyosato, Tokyo (JP); Mihoko Nakamura, Chofu (JP); Kazuhiro Kimura, Inagi (JP); Masayoshi Ikeda, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 14/128,722

(22) PCT Filed: Jun. 19, 2012

(86) PCT No.: PCT/JP2012/065562
§ 371 (c)(1),
(2), (4) Date: Dec. 23, 2013

(87) PCT Pub. No.: WO2012/176747
PCT Pub. Date: Dec. 27, 2012

(65) Prior Publication Data
US 2014/0138347 A1 May 22, 2014

(30) Foreign Application Priority Data
Jun. 24, 2011 (JP) .................................. 2011-140392

(51) Int. Cl.
*G01R 33/02* (2006.01)
*H01L 43/12* (2006.01)

(52) U.S. Cl.
CPC ..................................... *H01L 43/12* (2013.01)
USPC ............... 324/244; 257/295; 257/421; 257/2; 324/245; 324/246; 324/247

(58) Field of Classification Search
None
See application file for complete search history.

(56) References Cited

U.S. PATENT DOCUMENTS

2006/0131629 A1* 6/2006 Fukuzumi et al. ............ 257/295
2008/0241598 A1 10/2008 Fukuzumi et al.

FOREIGN PATENT DOCUMENTS

| JP | 2005-340260 A | 12/2005 |
| JP | 2006-060172 A | 3/2006 |
| JP | 2006-179701 A | 7/2006 |
| JP | 2009-032872 A | 2/2009 |

OTHER PUBLICATIONS

Translation of JP2006-060172, Aug. 24, 2004.*
Derwent-ACC-No. 2006-188687; Etching of metal film for use in manufacture of magnetic storage apparatus, involves patterning of metal film containing platinum and manganese by dry etching using etching gas containing halogen, hydrogen and nitrogen; abs; Aug. 24, 2004.*
International Search Report in PCT/JP2012/065562, issued Sep. 4, 2012 (2 pages).
International Preliminary Report on Patentability with transmittal in PCT/JP2012/065562, issued Dec. 27, 2013 (4 pages).

* cited by examiner

Primary Examiner — Duy Deo
(74) Attorney, Agent, or Firm — Fitzpatrick, Cella, Harper & Scinto

(57) ABSTRACT

In a method for manufacturing the functional element, a protective film covering an underlayer, a patterned multilayer film, and a patterned cap layer are formed, and the underlayer is then processed without newly forming a resist. Thereby, an electrode can be formed in steps less than ever before. Since the protective film formed on the patterned multilayer film and the patterned cap layer is used as a mask, the problem of the misregistration can be prevented.

6 Claims, 6 Drawing Sheets

METHOD FOR MANUFACTURING MAGNETORESISTANCE EFFECT ELEMENT

CROSS-REFERENCES TO RELATED APPLICATIONS

This application is a §371 national phase application of International Application No. PCT/JP2012/065562, filed Jun. 19, 2012, which claims the benefit of priority of Japanese Application No. 2011-140392, filed Jun. 24, 2011; the contents of the above-referenced patent applications, as well as the contents of all references, patent documents, and other documents cited in the present specification, are hereby incorporated by reference herein in their entireties.

TECHNICAL FIELD

The present invention relates to a method for manufacturing a magnetoresistance effect element.

BACKGROUND ART

An MRAM (Magnetic Random Access Memory) is a nonvolatile memory using a magnetoresistance effect such as TMR (Tunneling Magneto Resistive). The MRAM is attracting attention from the world as a revolutionary next-generation memory having an integrating density equal to that of a DRAM and a high speed equal to that of an SRAM and unlimitedly rewriting data.

As the constitution of the MRAM for example, an underlayer, a multilayer film having a basic structure having a magnetoresistance effect and a cap layer are formed in order on a silicon or glass substrate having a metal wiring line (word line). An antiferromagnetic layer, a magnetization fixed, layer, an insulating layer, and a magnetization free layer are laminated in order from the bottom thereof as examples of the multilayer film.

A magnetoresistance effect element is placed at an intersection point of a word line and a bit line used to read and write a signal, for example. An under layer as a bottom layer and a cap layer as top layer, of the magnetoresistance effect element are respectively processed into a lower electrode and an upper electrode. The lower electrode and the upper electrode are connected to a wiring line. Thereby, the magnetoresistance effect element is used as a memory cell playing a role of an electrode.

Applying electrical current perpendicularly to the upper electrode from the lower electrode in the magnetoresistance effect element freely changes the magnetization direction of the magnetization free layer. Thereby, the height of the electrical resistance value of the electrical current applied in the insulating layer is changed to "0" or "1". The magnetoresistance effect element exchanges information with the metal wiring line, to perform reading and writing.

An etching technique is generally used to process the magnetoresistance effect element. Examples of the etching technique include an ion beam etching (IBE) method and a reactive ion etching (RIE) method.

Conventionally, the lower electrode and the upper electrode are etched in different steps when the magnetoresistance effect element is processed (for example, see Patent Literature 1).

FIG. 6 represents conventional processing steps for a lower electrode and an upper electrode. FIG. 6A shows a substrate in which a multilayer film 12 and a cap layer 11 serving as an upper electrode are formed on an underlayer 13 formed on a wiring line 14. A state where a protective film 15 and an interlayer film 16 are formed on the substrate so as to cover the cap layer 11, the multilayer film, hp and the underlayer 13 is shown in FIG. 6B. Next, a state where a mask 17 is formed on the interlayer film 16 is shown in FIG. 6C. A state where the lower electrode is formed by transferring a pattern of the mask 11 to the interlayer film 16, the protective film 15, and the underlayer 13 by etching is shown in FIG. 6-D. From this state, a state where the mask 17 is removed is shown in FIG. 6E. Then, a state where the head of the cap layer 11 serving as the upper electrode is exposed by etching the interlayer film 16 and the protective film 15 is shown in FIG. 6F.

PRIOR ART REFERENCE

Patent Literature

Patent Literature 1: Japanese Patent Application Laid-Open No. 2006-60172

SUMMARY OF THE INVENTION

Problem to be Solved by the Invention

However, according to the processing method as shown in FIG. 6, many steps are required to manufacture the magnetoresistance effect element. Increases in the number of processing apparatuses and in size are not avoided according to the number of steps. Furthermore, the miniaturization of the element makes it difficult to form the mask formed on the interlayer film 16 on the multilayer film 12 with high accuracy, which may produce a problem of a misregistration. When the misregistration is produced, the protective film, of the sidewall of the multilayer film disappears, which may produce an electrical short circuit, to lose a function as the element.

The present invention has been made to solve the above-mentioned problems. It is an object of the invention to provide a method for manufacturing a magnetoresistance effect element which can process a lower electrode and an upper electrode in steps less than ever before, after processing a multilayer film.

Means for Solving the Problem

In order to solve the above-mentioned problems, the present invention is a method for manufacturing a magnetoresistance effect element, the magnetoresistance effect element comprising: an underlayer as a single layer film or a laminated film made of any of tantalum, titanium, aluminum, silicon, ruthenium, tantalum nitride, titanium nitride, ruthenium oxide, ruthenium nitride, tantalum carbide, and titanium carbide; a patterned multilayer film comprising an antiferromagnetic layer, a magnetization fixed layer, a barrier layer, and a magnetization free layer formed on the underlayer; and a patterned cap layer formed on the multilayer film, the method comprising: a protective film forming step of forming a protective film on a surface of the underlayer, a sidewall of the multilayer film, and a surface of the cap layer; and an electrode forming step of forming an upper electrode and a lower electrode in one step by etching predetermined ranges of the protective film and the underlayer.

Effects of the Invention

The present invention can process the lower electrode and the upper electrode in fewer steps after processing the multilayer film, and reduce the misregistration during processing.

MODE FOR CARRYING OUT THE INVENTION

Figure 4:
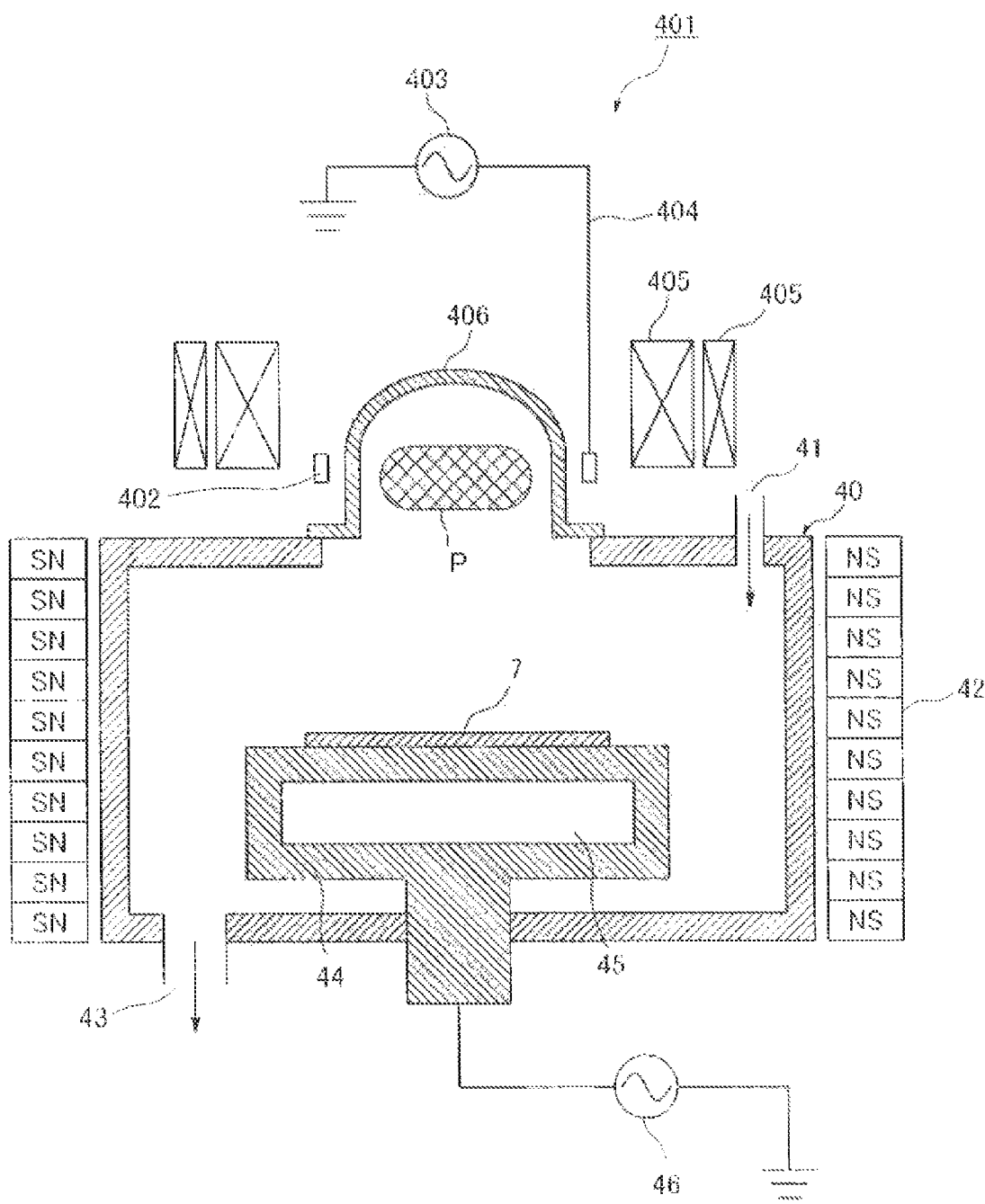
FIG. 4 illustrates a manufacturing apparatus (reactive ion etching apparatus) of the magnetoresistance effect element according to the embodiment of the present invention.

FIG. 4 illustrates an example of an etching apparatus suitable for the present embodiment.

The apparatus of FIG. 4 can process a magnetoresistance effect element using a reactive ion etching method. The etching apparatus includes a vacuum container 40 and a dielectric wall container 406 connected airtightly to the vacuum container 40 so as to communicate between the both spaces therein. The internal space of the vacuum container 40 is exhausted by an exhaust system 43. From a gate valve (not shown), a substrate 7 is transported into the vacuum container 40, where the substrate 7 is held by a substrate holder 44. The substrate holder 44 can be maintained at a predetermined temperature by a temperature control mechanism 45.

A large number of sidewall magnets 42 are disposed so as to be adjacent to one another on one outer sidewall of the vacuum container 40. Thereby, a cusp magnetic field is formed along the inner surface of the sidewall of the vacuum container 40. The cusp magnetic field prevents plasma from diffusing toward the inner surface of the sidewall or the vacuum container 40.

Next, an operation during etching execution will be described. First, a gas introduction system 41 is activated to introduce an etching gas at a predetermined flow rate into the vacuum container 40 from a cylinder in which the etching gas is stored through a pipe, a valve and a flow controller. The introduced etching gas diffuses by way of the vacuum container 40 into the dielectric wall container 406. Next, a plasma source 401 is activated. The plasma source 401 includes an antenna 402 generating an induction magnetic field in the dielectric wall container 406, a power supply 403 connected to the antenna 402 by a transmission line 404 through a matching unit (not shown), and an electromagnet 405. The electromagnet 405 generates a predetermined magnetic field in the dielectric wall container 406. The power supply 403 generates a high frequency power (source power) to be supplied to the antenna 402. When a high frequency generated by the high frequency power supply 403 for plasma is supplied to the antenna 402, a current flows in the antenna 402, with the result that plasma P is generated in the inside of the dielectric wall container 406.

The formed plasma P diffuses from the dielectric wall container 406 into the vacuum container 40, and reaches close to the surface of the substrate 7, to etch the surface of the substrate 7. In this situation, a power supply 46 for bias is simultaneously activated to control the incidence of an ion directed to the surface of the substrate 7 from the plasma.

Figure 5:
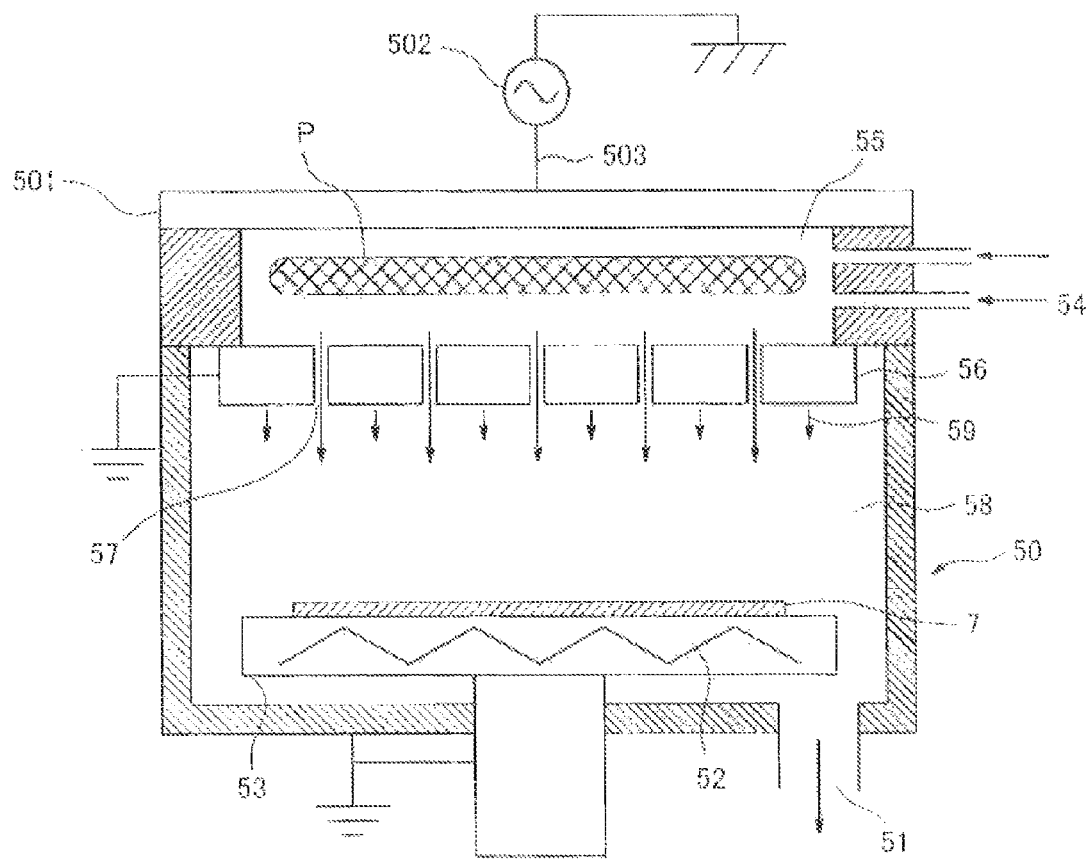
FIG. 5 illustrates a manufacturing apparatus (radical reactor) of the magnetoresistance effect element according to the embodiment of the present invention.
Figure 6A:
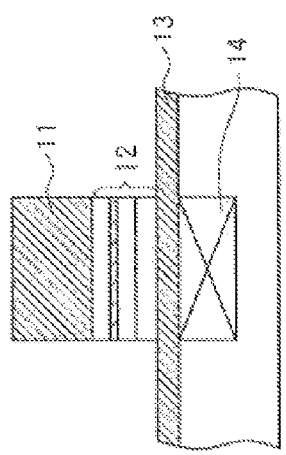
FIG. 6 illustrates a conventional method for manufacturing a magnetoresistance effect element.
Figure 6B:
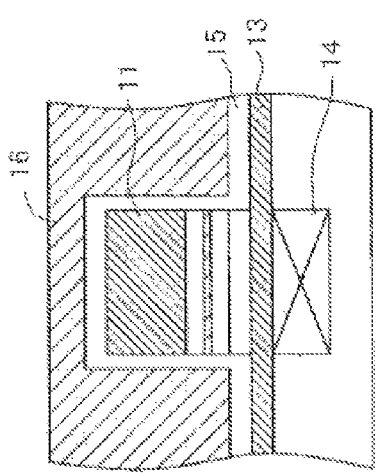
Figure 6C:
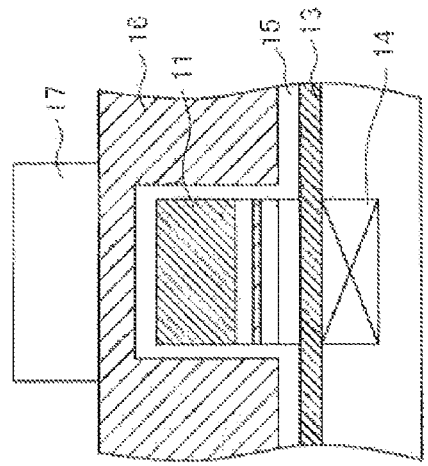
Figure 6D:
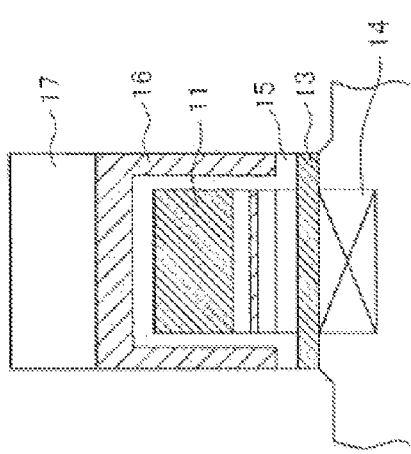
Figure 6E:
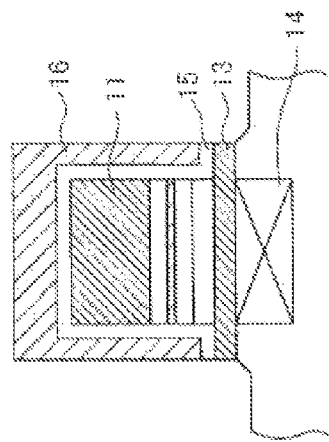
Figure 6F:
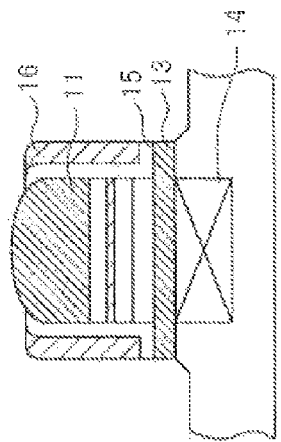

FIG. 5 illustrates an example of a film formation apparatus suitable for the present embodiment.

FIG. 5 shows an RS-CVD (Radical Shower Chemical Vapor Deposition) apparatus forming a film using a radical vapor-deposition method. The apparatus of FIG. 5 includes a vacuum container 50. The vacuum container 50 is exhausted by an exhaust system 51. The substrate 7 is transported info the vacuum container 50 from a gate valve (not shown), and is held by a substrate holder 53. The substrate holder 53 is maintained at a predetermined temperature by a heater 52.

Next, an operation during film formation execution of the apparatus shown in FIG. 5 will be described. First, a first gas introduction system 54 is activated, to introduce a film formation gas at a predetermined flow rate into the vacuum container 50 through a pipe, a valve, and a flow controller which are not shown, from a cylinder in which the film formation gas is stored. The introduced film formation gas diffuses into a plasma generation chamber 55. A high frequency power supply 502 is activated. A high frequency electrode 501 is connected to the high frequency power supply 502 by a transmission line 503. Plasma P is generated by supplying a high frequency power (for example, 13.56 MHz) to tins high frequency electrode 501 from the high frequency power supply 502. A partition plate 56 made of a conductive member is interposed between the plasma generation chamber 55 and a radical reaction chamber 58. The partition plate 56 has through holes 57. The partition plate 56 is equipped with a second gas introduction system 59, and can supply a source gas to the radical reaction chamber 58. The plasma P contains electrons, radicals and ions. The electrons and the ions are shielded by the partition plate 56 charged by high frequency discharge. The radicals selectively pass through the through holes 57, and are introduced into the radical reaction chamber 58. A source gas is introduced also from the second gas introduction system 59 of the partition plate 56, and is vapor-deposited on the substrate 7, to form a film.

Next a method for manufacturing the magnetoresistance effect element according to the present embodiment using the apparatus shown in FIGS. 4 and 5 described above will be described with reference to FIGS. 1 to 3. FIG. 1 schematically shows the method for manufacturing the magnetoresistance effect element according to the present embodiment. FIG. 2 schematically snows the structure of the magnetoresistance effect element according to the present embodiment. FIG. 3 schematically shows processing steps until a multilayer film 12 is processed in production of the magnetoresistance effect element according to the present embodiment.

As shown in FIG. 2, in a laminated structure of the magnetoresistance effect element in the present embodiment, a wiring line 14 (for example, Cu) is formed on a substrate made of silicon or glass or the like, for example. An underlayer 13 serving as a lower electrode joined with the wiring line 14 is formed on the wiring line 14. A multilayer film 12 having a magnetic junction part is formed on the underlayer 13. A cap layer 11 playing a role of an upper electrode is formed on the multilayer film 12, A hard mask (for example, $SiO_2$) 18 and a resist 19 are formed on the cap layer 11 to pattern the cap layer 11. The layers located above the cap layer 11 are appropriately selected according to an etching method and an etching object.

Since the underlayer 13 is processed into the lower electrode in the subsequent step, a conductive material is used for the underlayer 13. A single layer film or a laminated film which is made of tantalum, titanium, aluminum, silicon, and ruthenium, or tantalum nitride, titanium, nitride, ruthenium oxide, ruthenium nitride, tantalum carbide, and titanium carbide as conductive compounds thereof is suitable for the underlayer 13.

In the magnetic junction part of the multilayer film 12, an antiferromagnetic layer 124, a magnetization fixed layer 123, a barrier layer 122, and a magnetization free layer 121 are laminated in order from the bottom, thereof.

Since the cap layer 11 is processed into the upper electrode in the subsequent step, a conductive material is used for the cap layer 11. A single layer film or a laminated film which is made of tantalum and titanium, or tantalum nitride, titanium nitride, tantalum carbide, and titanium carbide as conductive compounds thereof is suitable for the cap layer 11.

In the present invention, a non-patterned structure where the underlayer serving as the lower electrode, the multilayer film, the cap layer, and the hard mash and the resist for patterning are laminated is referred to as the "laminated structure". An element in which the multilayer film, the cap layer, the hard mask, and the resist are processed by patterning, to form the lower electrode is referred to as the "magnetoresistance effect element". Furthermore, a film having a basic structure in a functional element such as the magnetoresistance effect element is referred to as the "multilayer film".

The laminated structure is processed using the apparatus shown in FIGS. 4 and 5, for example. One example thereof is shown FIG. 3.

Figure 3A:
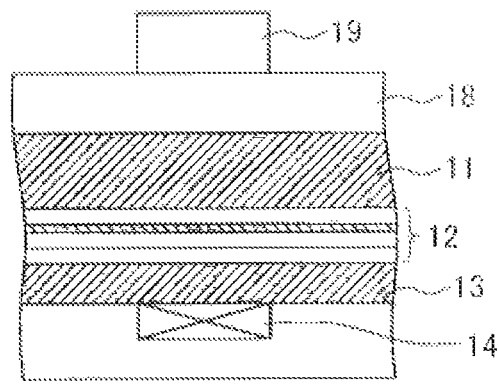
FIG. 3 illustrates a part of a manufacturing step of the magnetoresistance effect element according to the embodiment of the present invention.
Figure 3B:
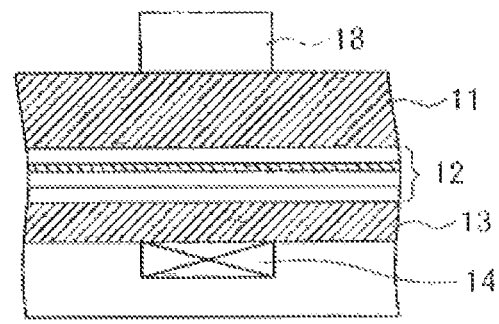
Figure 3C:
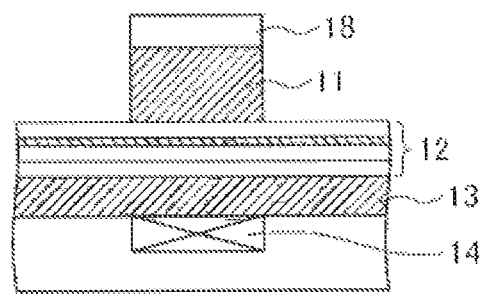
Figure 3D:
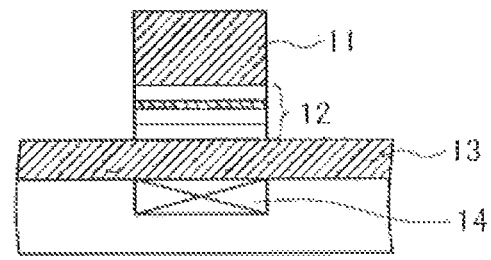

A state where the resist 19 is patterned is shown in FIG. 3A. From this state, the formed pattern of the resist is transferred to the hard mask 18 located below by RIE using a fluorocarbon as an etching gas. A state where the hard mask 18 is patterned and the resist 19 is then removed by an ashing treatment is shown in FIG. 3B. Next, a state where the formed pattern of the hard mask 18 is transferred to the cap layer 11 by RIE using a chlorine-based gas as an etching gas is shown in FIG. 3C. From this state, a state where the multilayer film 12 is processed by using the cap layer 11 as a mask by RIE using a carbon base gas such as an alcohol, as an etching gas is shown in FIG. 3D. When a carbon base gas such as an alcohol is used to etch the multilayer film 12, the underlayer 13 is hardly etched as shown in FIG. 3D and thereby the etching is stopped on the underlayer 13. An alcohol ($CH_3OH$, $C_2H_5OH$ or the like), a mixed gas ($CH_4+O_2$, $C_2H_6+N_2+O_2$, $C_2H_4+O_2$ or the like) obtained by adding oxygen and nitrogen to a hydrocarbon, a mixed gas of carbon monoxide and ammonia, and carbon dioxide or the like can be used as the carbon base gas.

A method for manufacturing the magnetoresistance effect element according to the present invention is shown in FIG. 1.

Figure 1A:
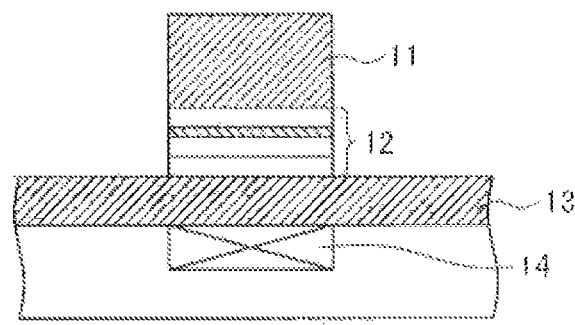
FIG. 1 illustrates a method for manufacturing a magnetoresistance effect element according to an embodiment or the present invention.
Figure 1B:
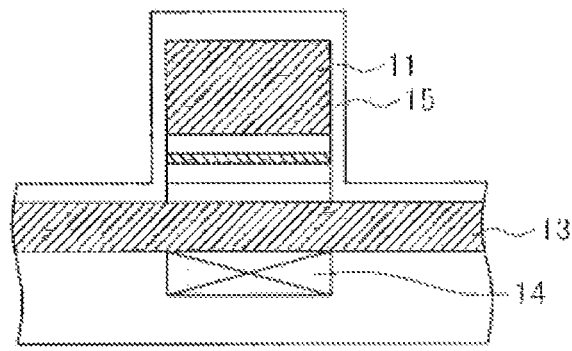
Figure 2:
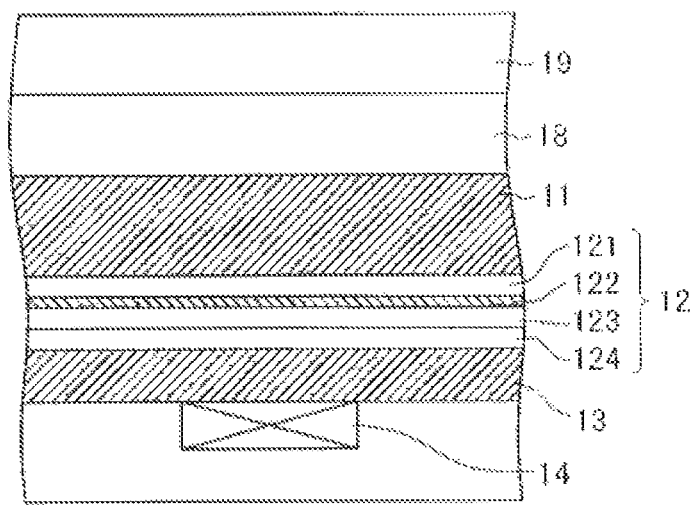
FIG. 2 illustrates an example of a structure of the magnetoresistance effect element according to the embodiment of the present invention.

FIG. 1A shows a state after the layers located above the underlayer 13 are patterned as described above. From this state, a state where a protective film 13 is formed on the underlayer 13, the multilayer film 12, and the cap layer 11 is shown in FIG. 1B. Various methods such as a sputtering method and a CVD method are used to form the protective film 15. From the viewpoint of securing a sufficient film forming amount on the sidewalls of the cap layer 11 and the multilayer film 12, the CVD method is preferable. Particularly, an RS-CVD method using the apparatus shown in FIG. 5 is used, and thereby the protective film can be sufficiently formed on the sidewalls of the multilayer film 12 and the cap layer 11, and damage to the element during film forming can be reduced.

Figure 1C:
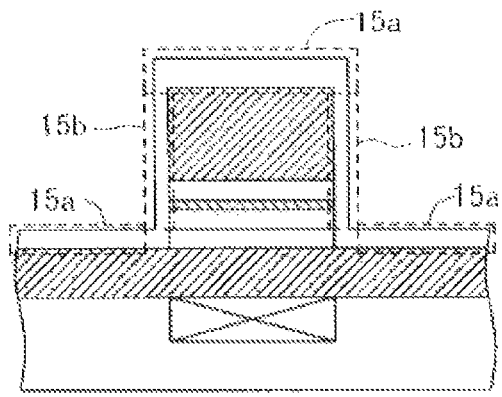

Herein, the protective film 15 in the state of FIG. 1B includes a sidewall part 15b and a surface part 15a. The sidewall part 15b is formed on the sidewall parts of the multilayer film 12 and the cap layer 11 after processing. The surface part 15a is a portion other than the sidewall part 15b of the protective film 15. That is the surface part 15a means a surface substantially parallel to a direction in a substrate plane. FIG. 1C shows the same state as that of FIG. 1B, and illustrates the surface part 15a and the sidewall part 15b.

Figure 1D:
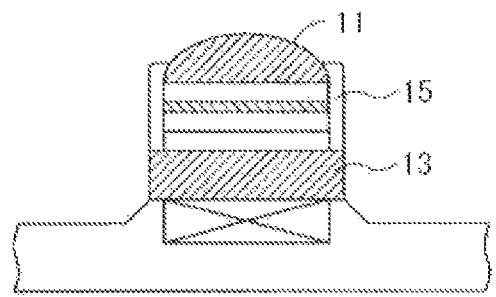

From the states shown in FIGS. 1B and 1C, the surface part 15a and the underlayer 13 are etched by using the protective film 15 as a mask. A situation thereof after etching is shown in FIG. 1D. According to the present invention, the surface part 15a and the underlayer 13 are processed in one etching step, and thereby the upper electrode and the lower electrode are simultaneously formed. When etching is performed, an IBE method and an RIE method or the like are used. In order to increase the etching amounts of the surface pairs 15a and the underlayer 13 to the etching amount of the sidewall part 15b, the RIE method is particularly preferable. Hereinafter, the etching amounts of the surface part 15a and the underlayer 13 to the etching amount of the sidewall part 15b are referred to as "anisotropy". That is, large anisotropy means that the etching amounts of the surface part 15a and the underlayer 13 to the etching amount of she sidewall part 15b are large. An insulating film is generally used as the protective film 15 in order to prevent an electrical short circuit.

Various gases such as Ar which is an inert gas can be used as the etching gas when etching is performed by the RIE method. However, a fluorocarbon and a hydrofluorocarbon (hereinafter, referred to collectively as at CF-based gas) are particularly suitable. $CF_4$ and $C_2F_6$ are suitable as the fluorocarbon, and $CHF_3$ is suitable as the hydrofluorocarbon. When the CF-based gas is used, the anisotropy can be increased. Furthermore, the protective film is formed on the sidewall part 15b by a carbon polymer generated during etching. Therefore, the possibility that the sidewall part 15b disappears while the underlayer 13 is processed can be reduced. When tire sidewall part 15b disappears while the surface part 15a and the underlayer 13 are processed, a conductive substance contained in the underlayer 13 adheres to the sidewall part of the multilayer film 12, which may cause an electrical short circuit.

Argon, helium, nitrogen, hydrogen, oxygen, and xenon or the like as an addition gas may be added into the CF-based gas.

When the CF-based gas is used as the etching gas, the anisotropy can be increased by using a silicon-based insulating film made of silicon oxide or silicon nitride or the like for the protective film 15.

In this situation, it is not necessary to perpendicularly process the underlayer 13 as shown in FIG. 1D. The underlayer 13 may be formed into a taper shape as long as the underlayer 13 is etched between the elements adjacent to each other, to prevent an electrical short circuit.

Thus, in the present, invention, the etching is performed by using the protective film 15 as a mask, and thereby the upper electrode and the lower electrode are formed in one etching step. Furthermore, since the protective film 15 formed on the patterned multilayer film 12 and the patterned cap layer 11 is also formed into a shape along the pattern, a problem of a misregistration of the lower electrode pattern can be prevented by using the protective film 15 as a mask.

In the above-mentioned embodiment, the surface part 15a and the underlayer 13 are etched by using the protective film 15 as a mask. However, the etching step may include a plurality of steps. As an example, the source power may be increased, in the initial stage of etching, and the source power may be continuously decreased toward the end stage of etching. In addition, the etching gas, a pressure in a treatment space, a gas flow rate, and a supply power to a plasma generation part or the like can be changed. In the above-mentioned etching step the etching may be performed in two or more steps according to the material of the protective film or the underlayer. As an example, a second etching step may be performed in a treatment space and an atmosphere different from those in a first etching step. In this case, the etching step is increased as compared with that in the present embodiment. However, the problem of the misregistration can be prevented.

It is preferable that the formation of the protective film 15 and the subsequent etching are consistently performed in vacuo. However, the protective film 10 may be taken out to the atmosphere after the protective film 15 is formed, and the subsequent etching may be performed in a different apparatus.

EXAMPLES

Example in which a magnetoresistance effect element is manufactured by using the present embodiment will be described later.

From a state shown in FIG. 1, a protective film 15 was formed by an RS-CVD method under the following condition using an apparatus shown in FIG. 5. Source gases 1 and 2 represent a gas introduced from a first gas introduction system 54. A source gas 3 represents a gas introduced from a second gas introduction system 59.

Source gas 1: $SiH_4$
Source gas 2: Ar
Source gas 3: $NH_3$
Flow rate of the source gas 1: 110 mL/min (sccm)
Flow rate of the source gas 2: 250 mL/min (sccm)
Flow rate of the source gas 3: 2500 mL/min (sccm)
Source power: 1000 W
Pressure in a vacuum container 50: 20 Pa
Temperature of a substrate holder holding a substrate 7: 180° C.

Next, from a state shown in FIG. 1, a surface part 15a and an under layer 13 were etched by an RIE method under the following condition using an apparatus shown in FIG. 4.
Etching gas: $CF_4$
Flow rate of the etching gas: 50 mL/min (sccm)
Sources power: 700 W
Bias power: 50 W
Pressure in a vacuum container 40: 0.4 Pa
Temperature of a substrate holder holding a substrate 7: 80° C.

When the magnetoresistance effect element manufactured by the above-mentioned Example was observed with a transmission electron microscope, it was confirmed that a lower electrode and an upper electrode were formed along the pattern of the magnetoresistance effect element.

In the above-mentioned embodiment, the magnetoresistance effect element has been described as an example. However, the present invention can be used also in methods for manufacturing various functional elements such as a resistive random access memory (ReRAM) and a ferroelectric random access memory (FeRAM). Also in these functional elements, a multilayer film having a basic structure of a functional element is patterned as in the present invention, and a protective film covering an underlayer and a multilayer film is then formed. The underlayer is processed by using the protective film as a mask. Thereby, a lower electrode can be formed. Therefore, when the present invention is used for these functional elements, the number of steps when the lower electrode is formed can be similarly reduced, and a misregistration can be prevented. Herein, the basic structure refers to a structure minimally required in order to exhibit a function thereof, such as a tunnel barrier layer producing a magnetoresistance effect in the magnetoresistance effect element, and one set of ferromagnetic layers, for example.

As described, above, the embodiment according to the present invention has been described with reference to the accompanying drawings. However, the present invention is not limited to the above-mentioned embodiment, and can be changed into various forms within the technical scope grasped from the description of the scope of claims.

The present invention can be used for a method for producing a functional element.

EXPLANATION OF REFERENCE NUMERALS

11 Cap layer
12 Multilayer film
13 Underlayer
14 Wiring line
15 Protective film
16 interlayer film
17 Mask
18 Hard mask
19 Resist
7 Substrate
40 Vacuum container
401 Plasma source
402 Antenna
403 High frequency power supply for plasma
404 Transmission line
405 Electromagnet
406 Dielectric wall container
41 Gas introduction system
42 Magnet
43 Exhaust system
44 Substrate holder
45 Temperature control mechanism
46 High frequency power supply for bias
50 Vacuum container
501 High frequency electrode
502 High frequency power supply
503 Transmission line
51 Exhaust system
52 heater
53 Substrate holder
54 First gas introduction system
55 Plasma generation chamber
56 Partition plate
57 Through hole
58 Radical reaction chamber
59 Second gas introduction system

The invention claimed is:
1. A method for manufacturing a magnetoresistance effect element, the magnetoresistance effect element comprising:
an underlayer as a single layer film or a multilayer film made of any of tantalum, titanium, aluminum, silicon, ruthenium, tantalum nitride, titanium nitride, ruthenium oxide, ruthenium nitride, tantalum carbide, and titanium carbide;
a patterned multilayer film comprising an antiferromagnetic layer, a magnetization fixed layer, a barrier layer, and a magnetization free layer formed on a first region of the underlayer; and
a patterned cap layer formed on the multilayer film, and the method comprising:
a protective film forming step of forming a protective film on a surface of a second region outside the first region of the underlayer, a sidewall of the multilayer film, and a surface of the cap layer; and an electrode forming step of forming an upper electrode and a lower electrode in one etching process which etches at least a portion of each of (a) the protective film formed on the surface of the second region of the underlayer, (b) the protective film formed on the surface of the cap layer, and (c) the second region of the underlayer, so that the cap layer is exposed to provide the upper electrode and the first region of the underlayer is exposed to provide the lower electrode.

2. The method for manufacturing a magnetoresistance effect element according to claim 1, wherein the etching is reactive ion etching.

3. The method for manufacturing a magnetoresistance effect element according to claim 2, wherein the protective film is formed by a CVD method.

4. The method for manufacturing a magnetoresistance effect element according to claim 3, wherein the protective film is made of silicon oxide or silicon nitride.

5. The method for manufacturing a magnetoresistance effect element according to claim 4, wherein the cap layer is a single layer film or a laminated film made of any of tantalum, titanium, tantalum nitride, titanium nitride, tantalum carbide, and titanium carbide.

6. The method for manufacturing a magnetoresistance effect element according to claim 5, wherein a fluorocarbon or a hydrofluorocarbon is used as an etching gas in the reactive ion etching.

* * * * *